(12) United States Patent
Biber et al.

(10) Patent No.: US 11,105,870 B2
(45) Date of Patent: Aug. 31, 2021

(54) COIL ARRANGEMENT FOR TRANSMITTING HIGH-FREQUENCY RADIATION

(71) Applicant: Siemens Healthcare GmbH, Erlangen (DE)

(72) Inventors: Stephan Biber, Erlangen (DE); Markus Vester, Nuremberg (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 106 days.

(21) Appl. No.: 15/967,695

(22) Filed: May 1, 2018

(65) Prior Publication Data

US 2018/0321340 A1 Nov. 8, 2018

(30) Foreign Application Priority Data

May 4, 2017 (DE) ...................... 10 2017 207 500.7

(51) Int. Cl.
*G01R 33/36* (2006.01)
*G01R 33/3415* (2006.01)
(Continued)

(52) U.S. Cl.
CPC ....... *G01R 33/3642* (2013.01); *G01R 33/307* (2013.01); *G01R 33/3415* (2013.01); *G01R 33/34053* (2013.01); *G01R 33/34076* (2013.01)

(58) Field of Classification Search
CPC ............ G01R 33/3642; G01R 33/3415; G01R 33/307; G01R 33/34053; G01R 33/34076
See application file for complete search history.

(56) References Cited

U.S. PATENT DOCUMENTS 2,878,443 A * 3/1959 Schuster ................ G01R 33/44
324/314
3,172,055 A * 3/1965 Abrabamson ............. H03L 7/26
331/94.1

(Continued)

FOREIGN PATENT DOCUMENTS

CN 1439335 A 9/2003
CN 101086525 A 12/2007
(Continued)

OTHER PUBLICATIONS http://www.antenna-theory.com/basics/efficiency.php (Year: 2009).*
(Continued)

*Primary Examiner* — Dixomara Vargas
(74) *Attorney, Agent, or Firm* — Harness, Dickey & Pierce, P.L.C.

(57) ABSTRACT

A coil arrangement is for transmitting high frequency radiation. In an embodiment, the coil arrangement includes a transmission coil with a planar design and a passive, tubular part-body coil. The part-body coil is designed to radially enclose an examination volume relative to a direction. The examination volume includes a part of a patient's body. Furthermore, the part-body coil and the transmission coil are galvanically decoupled, and at the same time the part-body coil and the transmission coil are inductively coupled. The transmission coil is designed, by way of an emitted first high frequency radiation, to excite the part-body coil inductively, causing an enforced electromagnetic oscillation. The part-body coil emits second high frequency radiation in the event of an enforced electromagnetic oscillation. The coil arrangement of an embodiment can be used in a magnetic resonance unit without an integrated high frequency unit.

33 Claims, 5 Drawing Sheets

(51) Int. Cl.
*G01R 33/30* (2006.01)
*G01R 33/34* (2006.01)

(56) References Cited

U.S. PATENT DOCUMENTS

| | | | |
|---|---|---|---|
| 4,638,253 A | 1/1987 | Jaskolski | |
| 4,680,549 A | 7/1987 | Tanttu | |
| 5,453,692 A | 9/1995 | Takahashi et al. | |
| 5,672,879 A * | 9/1997 | Glavish | H01J 37/1475 250/396 ML |
| 6,023,166 A * | 2/2000 | Eydelman | G01R 33/34053 324/318 |
| 6,501,274 B1 * | 12/2002 | Ledden | G01R 33/3453 324/318 |
| 6,577,888 B1 * | 6/2003 | Chan | A61B 5/0555 324/318 |
| 7,612,564 B1 * | 11/2009 | Hardy | G01R 33/365 324/318 |
| 8,046,046 B2 * | 10/2011 | Chan | G01R 33/3415 324/307 |
| 8,049,501 B2 * | 11/2011 | Hancu | G01R 33/34061 324/318 |
| 8,754,644 B2 * | 6/2014 | Trakic | G01R 33/422 324/307 |
| 2003/0158476 A1 | 8/2003 | Takabayashi et al. | |
| 2004/0124840 A1 * | 7/2004 | Reykowski | G01R 33/3415 324/318 |
| 2005/0107686 A1 * | 5/2005 | Chan | G01R 33/3415 600/422 |
| 2007/0079253 A1 * | 4/2007 | Leussler | G01R 33/34046 715/784 |
| 2008/0024133 A1 * | 1/2008 | Vaughan | G01R 33/34046 324/318 |
| 2008/0088311 A1 * | 4/2008 | Nakabayashi | G01R 33/3873 324/320 |
| 2008/0129298 A1 * | 6/2008 | Vaughan | G01R 33/5612 324/322 |
| 2008/0197849 A1 * | 8/2008 | Heid | G01R 33/56375 324/318 |
| 2008/0278167 A1 * | 11/2008 | Vaughan, Jr. | G01R 33/34046 324/318 |
| 2009/0096456 A1 | 4/2009 | Biber | |
| 2009/0256569 A1 * | 10/2009 | Hancu | G01R 33/34061 324/314 |
| 2010/0148775 A1 * | 6/2010 | Greim | G01R 33/3685 324/309 |
| 2011/0133734 A1 * | 6/2011 | Freytag | G01R 33/3614 324/307 |
| 2011/0210735 A1 * | 9/2011 | Trakic | G01R 33/5659 324/309 |
| 2012/0161772 A1 * | 6/2012 | Biber | G01R 33/3415 324/322 |
| 2012/0202697 A1 * | 8/2012 | Calvert | G01R 33/3858 505/163 |
| 2012/0310076 A1 * | 12/2012 | Buzug | A61B 5/05 600/409 |
| 2013/0221966 A1 * | 8/2013 | Zhu | G01R 33/3642 324/318 |
| 2015/0002156 A1 | 1/2015 | Leussler | |
| 2015/0130467 A1 | 5/2015 | Biber et al. | |
| 2015/0148663 A1 | 5/2015 | Vernickel et al. | |
| 2016/0131728 A1 | 5/2016 | Biber | |
| 2016/0306018 A1 * | 10/2016 | Freytag | G01R 33/3628 |
| 2018/0136293 A1 * | 5/2018 | Xie | A61B 5/055 |

FOREIGN PATENT DOCUMENTS

| | | |
|---|---|---|
| CN | 104471420 A | 3/2015 |
| DE | 4326516 C2 | 2/1998 |
| DE | 102007047020 A1 | 4/2009 |
| DE | 102014222938 A1 | 5/2016 |

OTHER PUBLICATIONS https://www.mriquestions.com/rf-transmit-coils.html (Year: 2020).*
Wang W. et al.: "Inductive Coupled Local TX Coil Design"; in: Proc. Intl. Soc. Mag. Reson. Med; vol. 18; p. 1510; 2010.
Bachschmidt, Theresa et al.: "Imaging of the Spine with Metal Implants Using High-Bandwidth RF Pulses from a Local Tx/Rx Coil"; proceedings of the ISMRM; p. 1659; 2015.
German Office Action #102017207500.7 dated Jan. 31, 2018.
Office Action for Chinese Patent Application No. 201810414591.5 dated Apr. 8, 2020 and English translation thereof.
LV Chao: "The Coil Optimization Analysis for Magnetic Coupling Resonance Wireless Power Transfer System", China Master's Theses Full-text Database, Engineering Technology Series II; 2015.
Office Action for Chinese Patent Application No. 201810414591.5 dated Feb. 7, 2021.
Office Action for Chinese Patent Application No. 20181041491.5 dated Jul. 1, 2021 and English translation thereof.
Cheong, Lee et al: "Helical Motion and 2D Locomotion of Magnetic Capsule Endoscope using Precessional and Gradient Magnetic Field" 2014 5th IEEE RAS & EMBS International Conference on Biomedical Robotics and Biomechatronics (BioRob): Aug. 12-15, 2014. São Paulo, Brazil.
Hu, GL et al: "A target field method for designing cylindrical z-gradient coil combined with vibration control", ACTA Phys. Sin.; vol. 63, No. 1; Year: 2014 (018301).

* cited by examiner

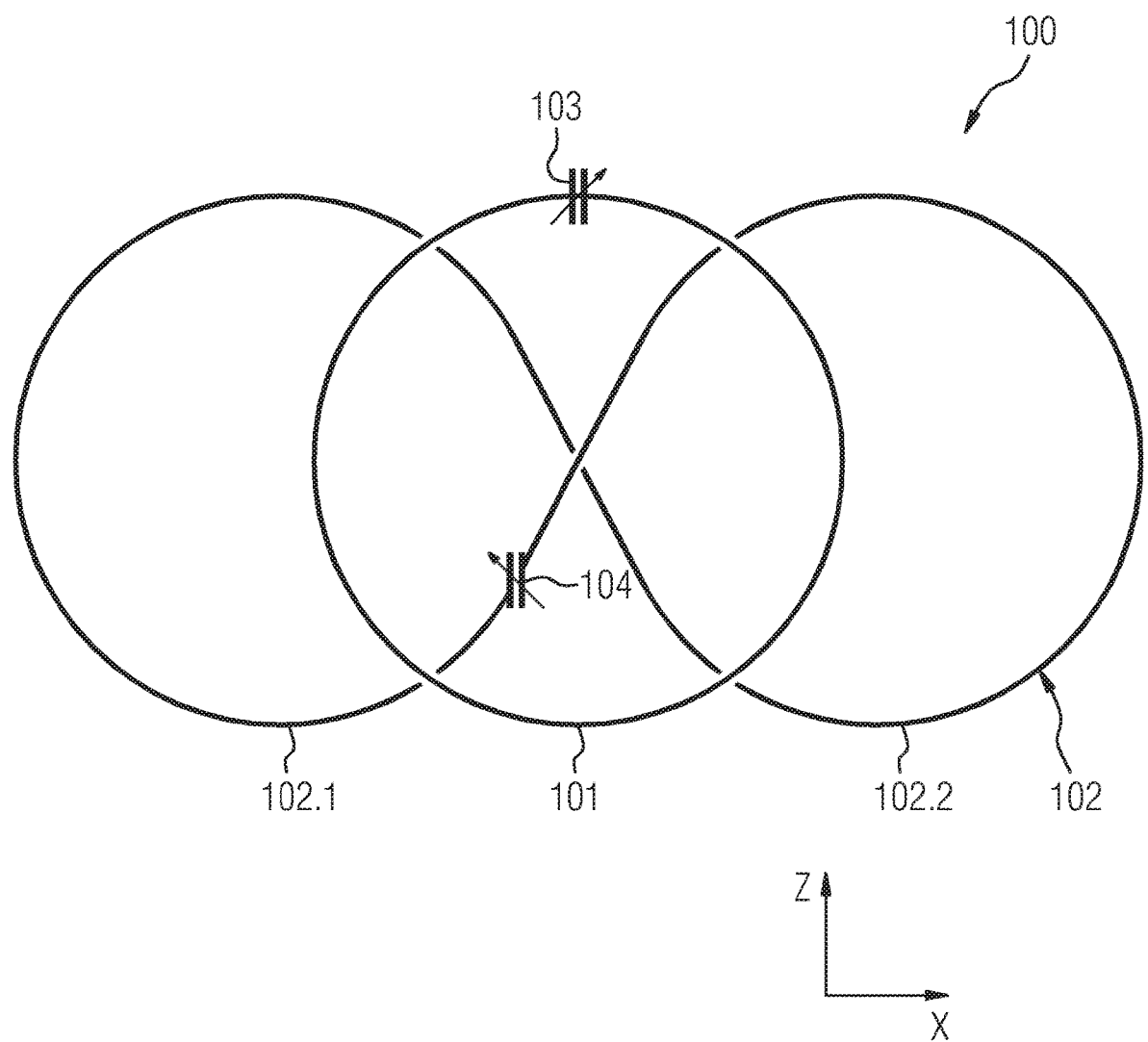

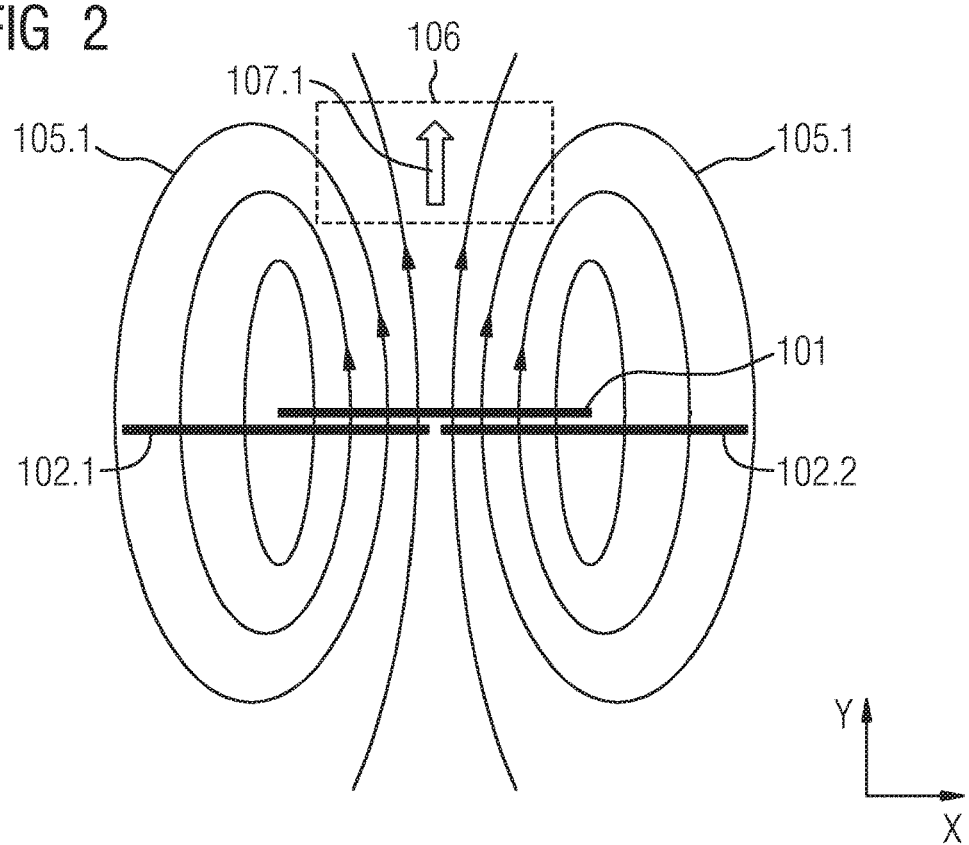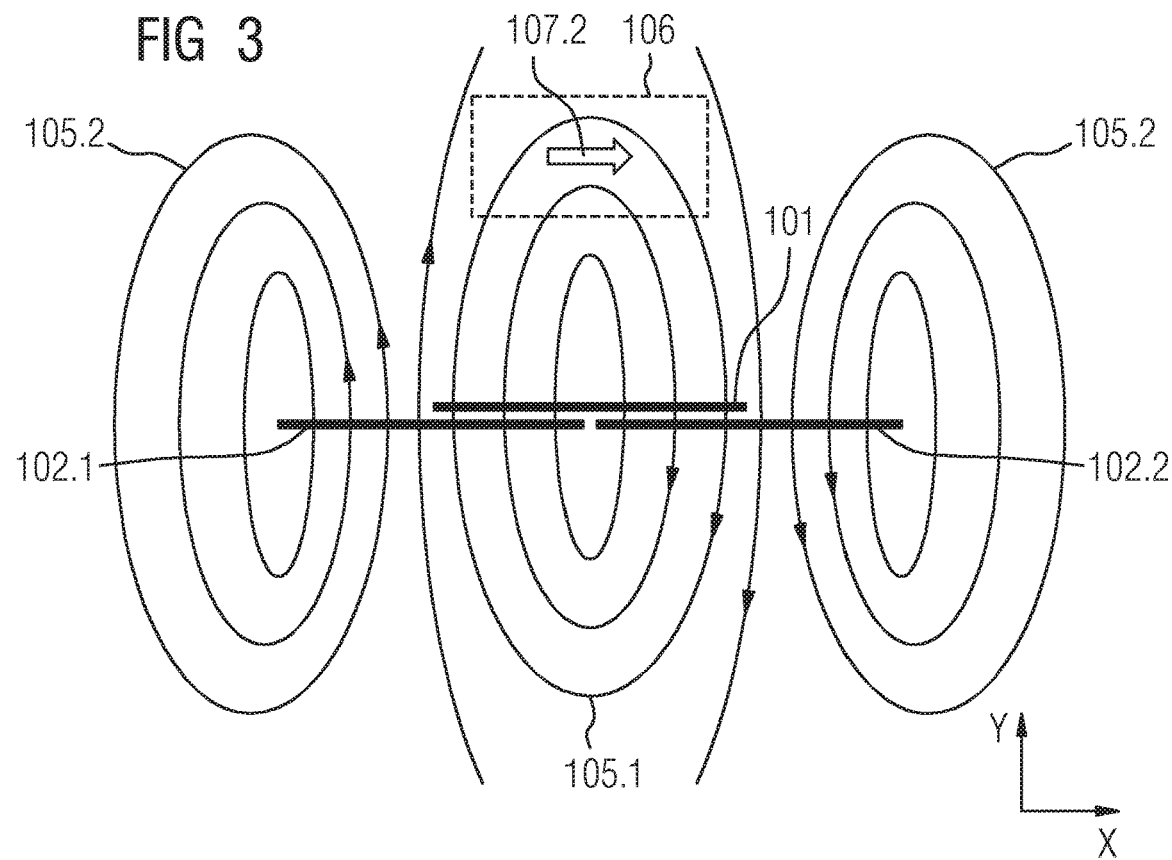

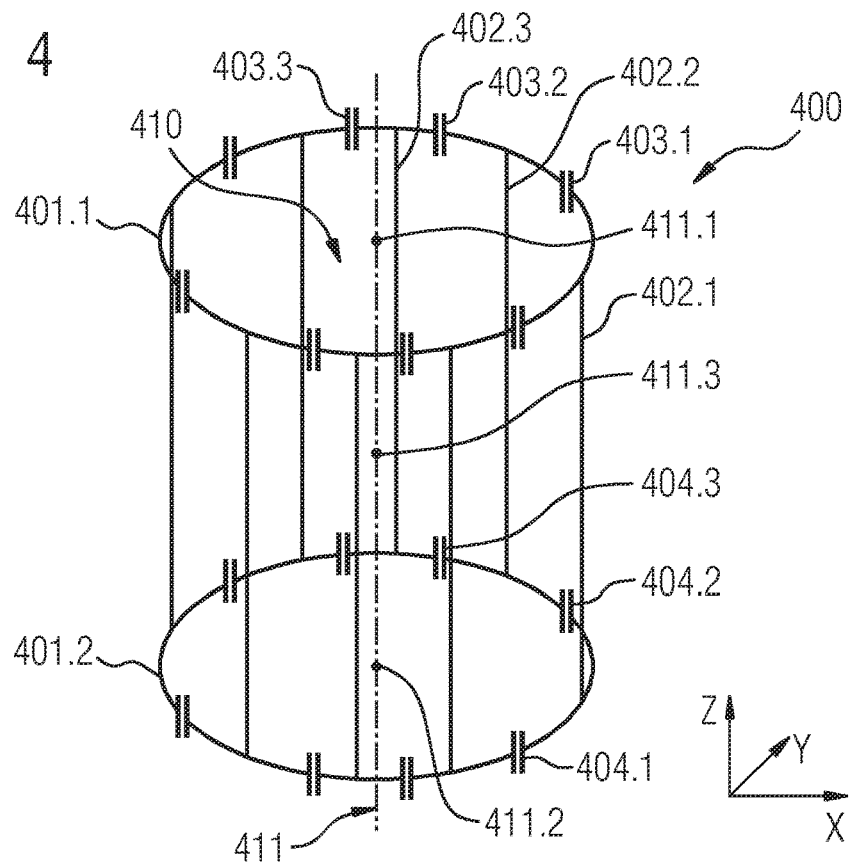
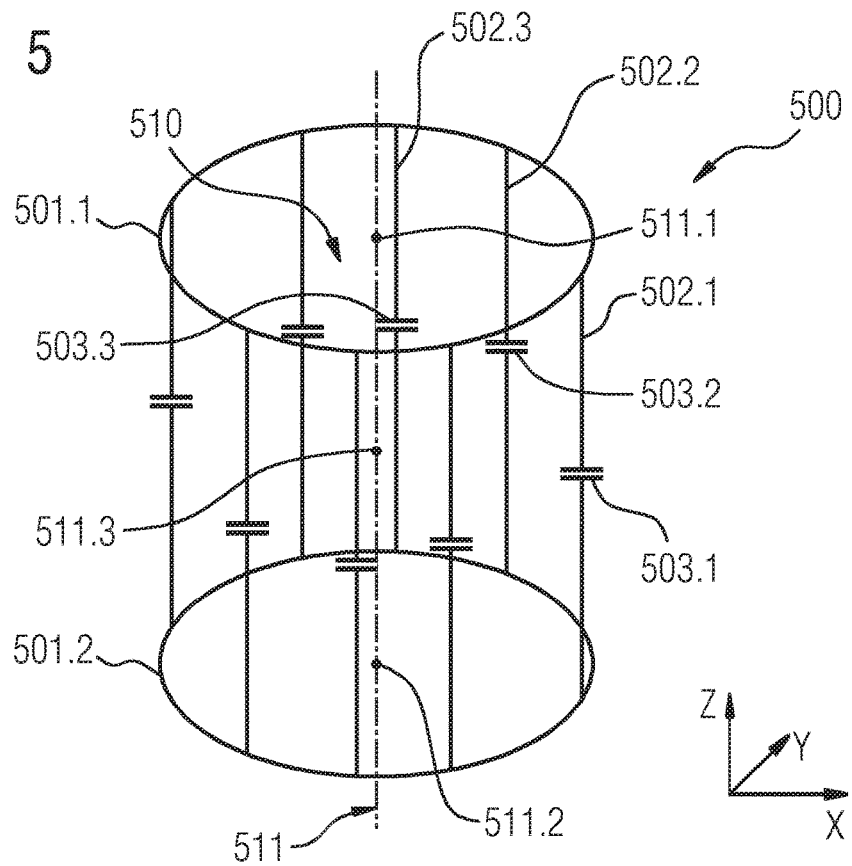

COIL ARRANGEMENT FOR TRANSMITTING HIGH-FREQUENCY RADIATION

PRIORITY STATEMENT

The present application hereby claims priority under 35 U.S.C. § 119 to German patent application number DE 102017207500.7 filed May 4, 2017, the entire contents of which are hereby incorporated herein by reference.

FIELD

At least one embodiment of the application generally relates to a coil arrangement for transmitting high-frequency radiation, a use of the coil arrangement according to at least one embodiment of the invention, and/or a method of using the coil arrangement according to at least one embodiment of the invention.

BACKGROUND

For magnetic resonance imaging (MR-imaging for short), very strong high frequency magnetic fields are required to excite spins in the atomic nuclei. These fields need to be as homogeneous as possible in the examination volume, and at the same time need to be as weak as possible outside the examination volume in order to keep the patient's exposure to heat as low as possible.

The use of whole body antennas which are fixedly integrated in the magnet unit (a synonym is "whole body coil", and a technical term is a "body coil") to transmit high frequency radiation is known, the body antenna being located between the gradient coil unit and the examination volume. Here, the supporting structure for the whole body antennas often at the same time forms the cylindrical wall of the patient tunnel. Since the high frequency magnetic field between the body antenna and the gradient coil unit has to be reduced in a field backflow space, and the size of this field backflow space determines the distance of the high frequency image currents and hence the degree of effectiveness of the body antenna, the field backflow space cannot be selected to be as small as desired (usually the cross section is 2 cm to 4 cm). As a result thereof, the main magnet and the gradient coil unit have to be built to be particularly large, which leads to high costs due to higher material and cooling requirements.

Furthermore, the structures of the whole body antenna are cost-intensive in production since the whole body antenna has to be arranged at a precise distance from the high frequency screen of the gradient coil unit, but at the same time has to support the patient's weight, however. Moreover, for high-volume excitation with a whole body antenna, a relatively large amount of high transmission power is required, which requires the use of efficient and cooling-intensive high frequency amplifiers. Furthermore, the high frequency field of such a whole body antenna is also very large, and in particular is also present outside the examination volume. Therefore, large parts of a patient who is being examined are exposed to heat, and the maximum output of the whole body antenna is restricted by limiting values for exposure to heat.

Furthermore, it is known to use local high frequency antennas which encompass a smaller volume, for example, a patient's knee. To activate these local high frequency antennas, however, a local transmitter output is required, which implies an additional technical complexity and costs for the power electronics of the magnetic resonance tomograph. Furthermore, in every examination, the connecting cables have to be set up at great expense such that they do not present a danger to the patient through inductive heating.

Patent specification U.S. Pat. No. 4,680,549 A1 describes how a local high frequency antenna can be resonantly excited by a whole body antenna installed in the magnet unit, and therefore greater field intensities can be achieved with the local high frequency antenna. As a result thereof, the transmission output can indeed be increased without heating the patient on a large scale, but the other aforementioned disadvantages of the whole body coil remain unchanged.

SUMMARY

At least one embodiment of the present invention provides a system with which high frequency radiation can be generated in an examination volume in a more favorable and more patient-friendly manner.

At least one embodiment of the present invention is directed to a coil arrangement for transmitting high frequency radiation and/or a use of the coil arrangement. Advantageous embodiments are described in the claims.

Embodiments of the present invention are described hereinafter both in relation to the coil arrangement and also in relation to the use. Features, advantages, or alternative embodiments mentioned here can equally well be transferred to the other claimed subject matter and vice versa. In other words, the apparatus claims (which are directed at a coil arrangement, for example) can also be further developed with the features described or claimed in conjunction with a use. The relevant functional features or features relating to the use are embodied by relevant apparatus modules.

At least one embodiment of the present invention relates to a coil arrangement for transmitting high frequency radiation, comprising a transmission coil with a planar design and a passive, tubular part-body coil. Here, the part-body coil is designed to radially enclose an examination volume relative to a preferred direction, the examination volume comprising a part of a patient's body. Furthermore, the part-body coil and the transmission coil are galvanically decoupled, and at the same time the part-body coil and the transmission coil are inductively coupled. The transmission coil is designed to excite the part-body coil inductively, causing an enforced electromagnetic oscillation by way of an emitted first high frequency radiation. Here, the part-body coil emits a second high frequency radiation in the event of an enforced electromagnetic oscillation.

At least one embodiment of the invention further relates to a use of the coil arrangement according to at least one embodiment of the invention or to a development of a coil arrangement according to at least one embodiment of the invention in a magnetic resonance unit to determine a magnetic resonance dataset relating to an examination volume. The inventors have realized that, through the use of the coil arrangement, a particularly fast and therefore cost-effective definition of a magnetic resonance dataset is possible.

At least one embodiment of the invention further relates to a method, comprising:

determining a magnetic resonance dataset relating to an examination volume, using of a coil arrangement in a magnetic resonance unit, the coil arrangement including a transmission coil including a planar design, and a passive, tubular part-body coil, designed to radially enclose an examination volume relative to a direction, the examination volume including a part of a body of a patient, wherein the passive, tubular part-body coil and the transmission coil are galvanically decoupled, and wherein the passive, tubular part-body coil and the transmission coil are inductively coupled, wherein the transmission coil is embodied, by way of an emitted first high frequency radiation, to excite the passive, tubular part-body coil inductively, to cause an enforced electromagnetic oscillation, and wherein the passive, tubular part-body coil is configured to emit second high frequency radiation in an event of an enforced electromagnetic oscillation.

BRIEF DESCRIPTION OF THE DRAWINGS

The figures show

FIG. 1 a loop butterfly coil as a transmission coil,

FIG. 2 a first magnetic field of a loop butterfly coil,

FIG. 3 a second magnetic field of a loop butterfly coil,

FIG. 4 a first embodiment of a birdcage coil as a part-body coil,

FIG. 5 a second embodiment of a birdcage coil as a part-body coil,

DETAILED DESCRIPTION OF THE EXAMPLE EMBODIMENTS

Figure 6:
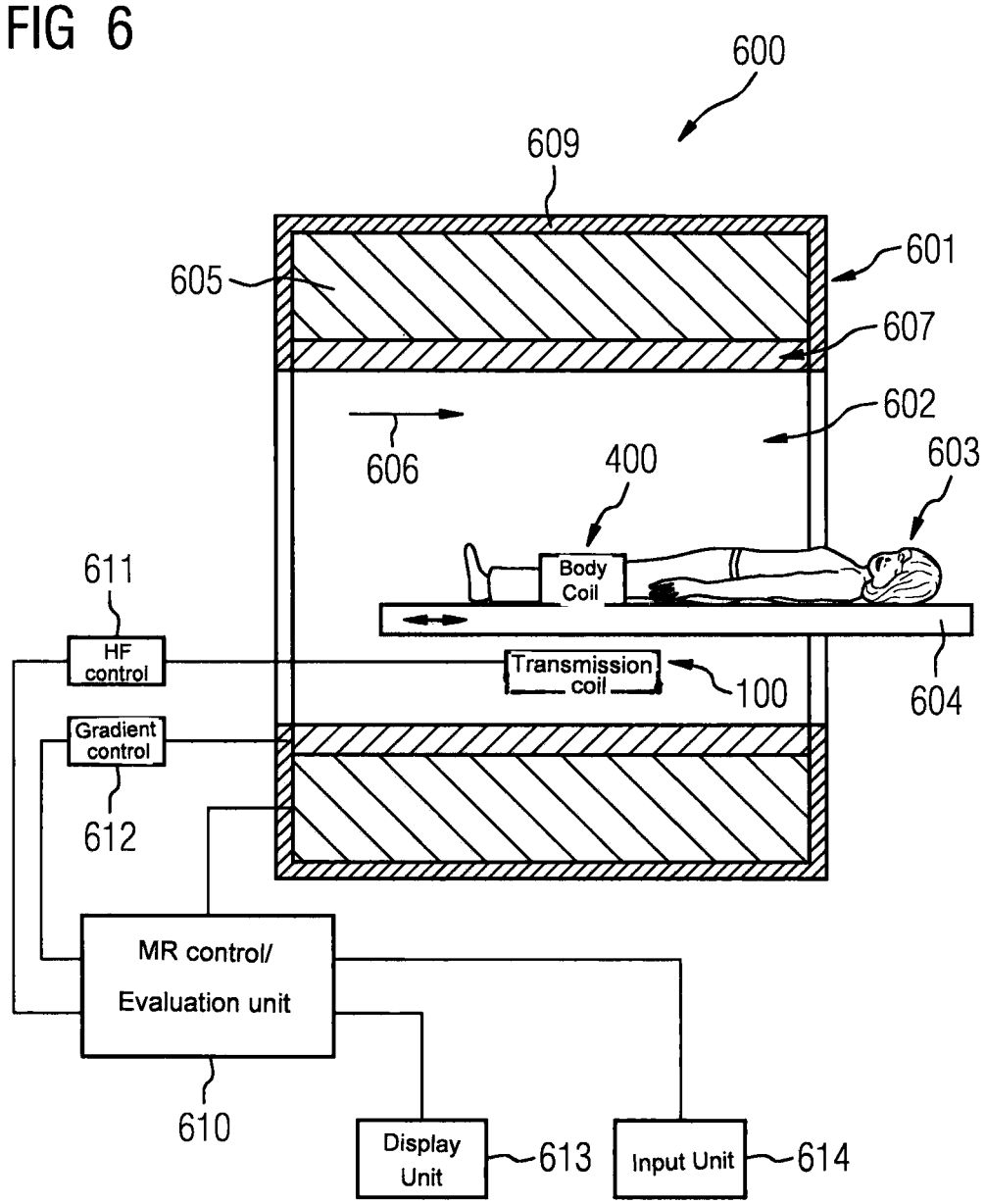
FIG. 6 a magnetic resonance unit including a transmission coil and a part-body coil, FIG. 7 a magnetic resonance unit including a first transmission coil and a part-body coil, FIG. 8 a magnetic resonance unit including a first transmission coil and a part-body coil.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the present invention relates to a coil arrangement for transmitting high frequency radiation, comprising a transmission coil with a planar design and a passive, tubular part-body coil. Here, the part-body coil is designed to radially enclose an examination volume relative to a preferred direction, the examination volume comprising a part of a patient's body. Furthermore, the part-body coil and the transmission coil are galvanically decoupled, and at the same time the part-body coil and the transmission coil are inductively coupled. The transmission coil is designed to excite the part-body coil inductively, causing an enforced electromagnetic oscillation by way of an emitted first high frequency radiation. Here, the part-body coil emits a second high frequency radiation in the event of an enforced electromagnetic oscillation.

The inventors have realized that by using such a coil arrangement, the whole body antenna of the magnetic resonance unit is not necessary. As a result thereof, in particular the main magnet and the gradient coil unit can be positioned closer to the patient, and therefore can be designed in particular to be smaller. As a result thereof, both in the main magnet and in the gradient coil unit, there is a saving in the amount of electrically conductive material, coolant, and insulation used. At the same time less cooling is required. As a result thereof, the entire magnetic resonance device can be built at lower cost. By using only inductive coupling between the part-body coil and the transmission coil, it is furthermore not necessary to connect the part-body coil to the magnetic resonance unit via a cable. This accelerates and simplifies the handling of the part-body coil, and at the same time this reduces the danger of injury to patients from cables that have been heated due to induction.

According to a further embodiment of the invention, the transmission coil is arranged outside the examination volume. The inventors have realized that through such an arrangement, the examination volume can be selected to be particularly small and therefore the part-body coil can be placed particularly close to a part of the patient's body. As a result thereof, high field intensities can be achieved in a particularly simple and cost-effective manner and at the same time the heat exposure for the patient outside the examination volume is reduced.

According to a further embodiment of the invention, the part-body coil and the transmission coil are designed to be arranged such that the coupling efficiency of the transmission coil and of the part-body coil is greater than 0.5, in particular greater than 0.8, in particular greater than 0.9, and in particular greater than 0.99. The term used for this is "coupling efficiency". The inventors have realized that by way of such a coupling efficiency, the transmission output of the transmission coil can be selected to be as low as possible. As a result thereof, as little as possible exposure of the patient to heat occurs outside the examination volume. As a result thereof, in particular greater field intensities can be selected in the examination volume without exceeding limiting values for patient exposure to heat.

According to a further embodiment of the invention, the transmission coil is designed to generate in the examination volume a magnetic field parallel to a first magnetic field direction when the transmission coil and the part-body coil are arranged such that the coupling efficiency of the transmission coil and of the part-body coil is greater than 0.5, in particular greater than 0.8, in particular greater than 0.9, and in particular greater than 0.99, the first magnetic field direction being perpendicular to the preferred direction. In particular, the transmission coil is likewise designed to generate in the examination volume a magnetic field parallel to a second magnetic field direction when the transmission coil and the part-body coil are arranged such that the coupling efficiency of the transmission coil and of the part-body coil is greater than 0.5, in particular greater than 0.8, in particular greater than 0.9, and in particular greater than 0.99, the second magnetic field direction being perpendicular to the preferred direction and the second magnetic field direction being perpendicular to the first magnetic field direction. The inventors have realized that, through having such a magnetic field in the examination volume, particularly good magnetic resonance imaging is possible.

According to a further embodiment of the invention, a capacitance and an inductance of the part-body coil are designed such that the resonant frequency of the part-body coil corresponds to the frequency of the first high frequency radiation. Another word for resonant frequency is natural frequency. The inventors have realized that, through such a selection of the resonant frequency, a particularly good coupling of the part-body coil and of the transmission coil can be achieved. In this case, therefore, a particularly low transmission output of the transmission coil is necessary.

According to a further embodiment of the invention, the part-body coil is designed to excite a nuclear spin in the examination volume causing a precession around the axis of a main magnetic field when the part-body coil is arranged in the main magnetic field such that the preferred direction and the axis of the main magnetic field are in parallel. The inventors have realized that through having a part-body coil designed in such a way, particularly good magnetic resonance imaging is possible.

According to a further embodiment of the invention, the frequency of the second high frequency radiation corresponds to the Larmor frequency of an atomic nucleus in the examination volume relative to the main magnetic field. In particular, the frequency of the first high frequency radiation can correspond to this Larmor frequency. In particular, the resonant frequency of the part-body coil corresponds to the frequency of the second high frequency radiation and hence to this Larmor frequency. An atomic nucleus can in particular be a hydrogen nucleus. The inventors have realized that, by choosing the Larmor frequency, a particularly effective excitation of an atomic nucleus is possible in the examination volume and therefore the transmission output of the transmission coil and/or the transmission output of the part-body coil can be selected to be as low as possible.

According to a further embodiment of the invention, the second high frequency radiation is circularly polarized around the axis of the main magnetic field. The inventors have realized that through circular polarization, the nuclear spin can be excited particularly well to cause precession around the axis of the main magnetic field.

According to a further embodiment of the invention, the transmission coil is designed as part of a patient-positioning apparatus and can be moved simultaneously with the patient-positioning apparatus. The inventors have realized that, as a result thereof, a particularly simple and cost-effective cabling for the transmission coil is possible.

According to a further embodiment of the invention, the transmission coil is designed as part of a magnet unit, the relative position between the transmission coil and a patient-positioning apparatus being modifiable. The inventors have realized that, as a result thereof, the transmission coil can be particularly precisely positioned in a main magnetic field of the magnet unit. As a result thereof, the transmission coil can in particular be arranged such that the part-body coil is arranged with great coupling efficiency in a position with a high homogeneity of the main magnetic field.

According to a further embodiment of the invention, the transmission coil is designed as a loop butterfly coil. The inventors have realized that, by using in each case a part of the loop butterfly coil inside the part-body coil, a first magnetic field perpendicular to the preferred direction and a second magnetic field perpendicular to the preferred direction and perpendicular to the first magnetic field can be generated. Through this alternating magnetic field, a particularly good and selective excitation of the part-body coil is possible, in particular such that said coil generates an alternating magnetic field that is circularly polarized.

According to a further embodiment of the invention, the part-body coil is designed as a birdcage coil. The inventors have realized that, by way of a birdcage coil, second high frequency radiation particularly well suited for exciting a nuclear spin can be generated.

According to a further embodiment of the invention, the part-body coil is further designed to receive third high frequency radiation. Third high frequency radiation involves in particular relaxation radiation of excited nuclear spins. The inventors have realized that by having a part-body coil designed in such a way, a separate receiving coil does not have to be used. This is therefore more cost-effective than the separate use of a receiving coil, and furthermore there is no need for a cable connection between the receiving coil and the magnetic resonance unit if the part-body coil is read via the transmission coil.

According to a further embodiment of the invention, the transmission coil is furthermore embodied to excite a nuclear spin with the part-body coil creating a precession around the axis of a main magnetic field without inductive coupling. In particular, the transmission coil can furthermore be embodied to receive relaxation radiation from the nuclear spin that has been excited. The inventors have realized that, as a result thereof, it is possible to use the coil arrangement in a more flexible manner and for more types of examinations.

At least one embodiment of the invention further relates to the use of the coil arrangement according to at least one embodiment of the invention or to a development of a coil arrangement according to at least one embodiment of the invention in a magnetic resonance unit to determine a magnetic resonance dataset relating to an examination volume. The inventors have realized that, through the use of the coil arrangement, a particularly fast and therefore cost-effective definition of a magnetic resonance dataset is possible.

According to a further embodiment of the invention, the part-body coil is placed on the patient-positioning apparatus on the basis of a marking on the patient-positioning apparatus. The inventors have realized that, as a result thereof, a high coupling efficiency can be achieved between the part-body coil and the transmission coil in a particularly simple manner, in particular when the transmission coil is fixedly connected to the patient-positioning apparatus.

According to a further embodiment of the invention, the transmission coil transmits high frequency radiation. Furthermore, the part-body coil is placed on the basis of a comparison of a first measurement and of a second measurement of an electrical parameter of the transmission coil, the part-body coil having a first position relative to the transmission coil in a first measurement, and the part-body coil having a second position relative to the transmission coil in the second measurement. The inventors have realized that, through such a method, the part-body coil can be placed relative to the transmission coil such that the coupling efficiency becomes particularly high. As a result thereof, the transmission output of the transmission coil in particular can be selected to be particularly low.

A transmission coil is even described as being planar in design when it is curved relative to an axis and the transmission coil can therefore in particular even be designed to be semi-tubular. A transmission coil can even be described as being planar in design if it is curved relative to more than one axis.

High frequency radiation is in particular electromagnetic high frequency radiation, in particular with a frequency between 3 Hz and 3 THz ("Hz" being the abbreviation for the unit Hertz, which is defined in SI units as inverse seconds), in particular between 4 MHz and 4 GHz, in particular between 8 MHz and 500 MHz, and in particular with a frequency of 63 MHz or 123 MH. In particular, a high frequency alternating field is also described as high frequency radiation, and in particular an electromagnetic high frequency alternating field is described as electromagnetic high frequency radiation. Electromagnetic high frequency radiation involves alternating electric and magnetic fields that are present at the same time. Here the directions of the electric field and of the magnetic field are in particular always orthogonal and span the polarization plane.

Electromagnetic high frequency radiation can in particular be polarized in a linear or circular manner. In the case of linear polarization in particular, the respective direction of the magnetic field is constant whilst the intensity of the magnetic field changes over time. In the case of circular polarization, the intensity of the magnetic field in particular is constant, whilst the direction of the magnetic field uniformly rotates in the polarization plane. The use of the term high frequency radiation does not in particular necessarily imply that energy is radiated to outside the coil arrangement; in particular energy is only transmitted between the part-body coil and the transmission coil.

Below, high frequency radiation is described in particular with reference to the magnetic field. Of course, in the case of a variable magnetic field, an electric field is always also present, a description of which is dispensed with, however. Furthermore, static magnetic fields are also described below. This is to be understood such that static magnetic fields in particular can be snapshots of an alternating magnetic field.

A first frequency and a second frequency correspond to one another when the percentage deviation of the first frequency from the second frequency is less than 50%, in particular less than 20%, in particular less than 10%, in particular less than 5%, in particular less than 1%, and in particular less than 0.1%. The deviation of a first frequency from a second frequency is calculated in particular by dividing the value of the difference between the first frequency and the second frequency by the first frequency or by dividing the value of the difference between the first frequency and the second frequency by the second frequency. The percentage deviation is in particular the deviation defined in the form of a percentage.

A first direction and a second direction are in parallel when the minimum angle between the first directional vector in the first direction and the second directional vector in the second direction is lower than 10° or greater than 170°, in particular lower than 5° or greater than 175°, in particular lower than 1° or greater than 179°.

The coupling efficiency η of two loops or conductor loops is defined as $$\eta = 1 - \frac{1}{k \cdot Q_1 \cdot Q_2},$$

where k is the coupling factor between the two coils or conductor loops, where $Q_1$ is the quality of the first coil or of the first conductor loop, and where $Q_2$ is the quality of the second coil or of the second conductor loop. The quality $Q=X_L/R$ of a coil or of a conductor loop is defined as the quotient of the reactance $X_L$ and of the effective resistance R of the coil or of the conductor loop. The coupling factor k between the two coils or the two conductor loops is defined as the ratio of the magnetic flow in the first coil or in the first conductor loop through the second coil or the second conductor loop to the magnetic flow in the first coil.

FIG. 1 shows a loop butterfly coil as a transmission coil 100. The loop butterfly coil comprises a first conductor loop 101 and a second conductor loop 102, wherein both the first conductor loop 101 and the second conductor loop 102 are designed to conduct electricity. The first conductor loop 101 is circular in design, and the second conductor loop 102 is designed in the form of a figure eight. The central point of the first conductor loop 101 is located above or below the point at which the second conductor loop 102 overlaps with itself. The second conductor loop 102 can also be described as an arrangement of two approximately circular subconductor loops 102.1, 102.2, the circumferential direction of the current in the first circular subconductor loop 102.1 always being inverse to the current in the second circular semiconductor loop 102.2.

In the example embodiment shown, the first conductor loop 101 and the second conductor loop 102 are designed to conduct electricity by including an electricity-conducting material, in particular copper. The first conductor loop 101 and/or the second conductor loop 102 can include in particular an electricity-conducting wire that is shaped according to the shape of the respective conductor loop 101, 102. The first conductor loop 101 and/or the second conductor loop 102 can further include insulation for the wire. In particular, the insulation can completely enclose the wire up to the connection points. Polyethylene, polyurethane and polyvinyl chloride are known as insulation materials. In the embodiment shown, the first conductor loop 101 and the second conductor loop 102 are embodied as copper wires that are sheathed in polyurethane.

In this example embodiment, the conductor loop 101 is planar in design relative to a first axis X and a third axis Z; the second conductor loop 102 is likewise planar in design in this example embodiment relative to a first axis X and a third axis Z. Here the first axis X forms, with a second axis Y and the third axis Z, a Cartesian coordinate system pointing to the right. In an alternative example embodiment, the second conductor loop 102 can be curved relative to an axis that is parallel to the third axis Z; in particular the second conductor loop 102 can be curved in a semi-tubular shape around an axis that is parallel to the third axis Z.

In the example embodiment shown, the first conductor loop 101 includes a first variable capacitor $C_1$; the second conductor loop 102 includes a second variable capacitor $C_2$ 104. In the example embodiment shown, the first variable capacitor and the second variable capacitor are embodied as rotary condensers 103, 104. Various embodiments of rotary condensers are known to a person skilled in the art and are not described in further detail here. Alternatively, it is also possible to provide a first constant capacitor instead of the first variable capacitor, and it is also further possible to provide a second constant capacitor instead of the second variable capacitor. A first constant capacitor or a second constant capacitor can be embodied in the form of a condenser.

Due to its geometric shape, the first conductor loop 101 forms a first inductance $L_1$, and due to its geometric shape, the second conductor loop 102 forms a second inductance $L_2$. For the inductance L of a circular conductor loop, the formula $$L = \mu_0 \frac{d_s}{2} \log\left(\frac{d_s}{d_d}\right)$$

is known, $\mu_0$ being the magnetic field constant, $d_s$ the diameter of the conductor loop and $d_d$ the diameter of the wire. A circular conductor loop that has flowing through it a constant current I generates a magnetic field B relative to the axis of symmetry of the conductor loop, said magnetic field being defined as $$B(y) = \frac{\mu_0 I}{2} \cdot \frac{d_s^2}{(d_s^2 + y^2)^{3/2}}$$

by the Biot-Savart law. At a great distance from the conductor loop, the magnetic field B is a dipole field. The magnetic field is aligned parallel or antiparallel to the axis of symmetry of the conductor loop. In the example embodiment shown, the axis of symmetry of the first conductor loop 101 is parallel to the second direction Y and runs through the central point of the first conductor loop 101. The second inductance $L_2$ of the second conductor loop 102 can be calculated as the sum of the inductance of the first subconductor loop 102.1 and the inductance of the second subconductor loop 102.2, ignoring the self-induction. Alternatively, the second inductance $L_2$ can also be determined using the Biot-Savart law.

The natural angular frequency $\omega_1$ of the first conductor loop 101 is defined by $\omega_1 = (L_1 \cdot C_1)^{-1/2}$, and the natural angular frequency $\omega_2$ of the second conductor loop 102 is defined by $\omega_2 = (L_2 \cdot C_2)^{-1/2}$. In the example embodiment shown, $C_1$ and $C_2$ are selected such that $\omega_1 = \omega_2$. The natural frequency f of a conductor loop is defined as $\omega/2\pi$. Another term also used for natural frequency is resonant frequency. In the example embodiment shown, $C_1$ and $C_2$ are selected such that the natural frequencies $f_1$ and $f_2$ each correspond to the frequency of the part-body coil 400, 500.

FIG. 2 shows the field lines of a first magnetic field 105.1 of the transmission coil 100, which coil is embodied as a loop butterfly coil. FIG. 3 shows the field lines of a second magnetic field 105.2 of the transmission coil 100, which is embodied as a loop butterfly coil. To generate the first magnetic field 105.1 shown in FIG. 2, the first conductor loop 101 has a current flowing through it, whereas no current flows through the second conductor loop 102. To generate the second magnetic field 105.2 shown in FIG. 3, no current flows through the first conductor loop 101, whereas a current flows through the second conductor loop 102.

The first conductor loop 101 is designed to generate a first magnetic field 105.1 parallel or antiparallel to the second axis Y when a current flows through it. Both the first subconductor loop 102.1 and the second subconductor loop 102.2 of the second conductor loop 102 are likewise designed to generate a second magnetic field 105.2 parallel or antiparallel to the second axis Y, inside the circuit formed by the respective subconductor loop 102.1, 102.2 when a current flows through them. Here, the second magnetic field 105.2 inside the circuit formed by the first subconductor loop 102.1 is parallel to the second axis Y and the second magnetic field 105.2 inside the circuit formed by the second subconductor loop 102.2 is antiparallel to the second axis Y, or the second magnetic field 105.2 inside the circuit formed by the first subconductor loop 102.1 is antiparallel to the second axis Y and the second magnetic field 105.2 inside the circuit formed by the second subconductor loop 102.2 is parallel to the second axis Y. As a result thereof, a region is created above and a region is created below the first conductor loop 101 with a magnetic field parallel or antiparallel to the first axis X.

FIG. 2 and FIG. 3 show a region 106 in which the part-body coil 400, 500 can be positioned. If, as shown in FIG. 2, the first conductor loop 101 has a current flowing through it, in the region 106 a first effective magnetic field 107.1 is generated, the first effective magnetic field having a component parallel to the second axis Y. If, as shown in FIG. 3, the second conductor loop 102 has a current flowing through it, in the region 106 a second effective magnetic field 107.2 is generated, the second effective magnetic field having a component parallel to the first axis X.

When a first alternating current with the first natural frequency $f_1$ flows in the first conductor loop 101 and when a second one flows in the second conductor loop 102 with the second natural frequency $f_2 = f_1$, the first alternating current and the second alternating current having a phase shift of $\pi/2$, then a circularly polarized effective alternating magnetic field can be generated in the region 106, the polarization plane being parallel to the first axis X and parallel to the second axis Y. At the same time, a circularly polarized electric alternating magnetic field is generated such that, in the region 106, circularly polarized high frequency radiation can be generated, the polarization plane being parallel to the first axis X and parallel to the second axis Y. The frequency of the alternating radiation corresponds to the natural frequency $f_2 = f_1$ of the first conductor loop 101 and of the second conductor loop 102.

FIG. 4 and FIG. 5 show two example embodiments of part-body coils 400, 500. In both example embodiments, the part-body coils 400, 500 include two circular conductor loops 401.1, 401.2, 501.1, 501.2, which are connected by an even number of straight conductors 402.1, 402.2, 402.3, 502.1, 502.2, and 502.3, such that the conductor loops 401.1, 401.2, 501.1, 501.2 and the straight conductors 402.1, 402.2, 402.3, 502.1, 502.2, 502.3 can be designed as straight sections in an outer surface of a cylinder, the cylinder being symmetrical relative to a preferred direction 411, 511 of the part-body coil 400, 500. In the orientation shown, the circular conductor loops 401.1, 401.2, 501.1, 501.2 are embodied orthogonally to the preferred direction 411, 511, and the straight conductors 402.1, 402.2, 402.3, 502.1, 502.2, 502.3 are embodied parallel to the preferred direction 411, 511. In the drawing, the preferred direction is parallel to the third axis Z.

The preferred direction 411, 511 intersects the first of the circular conductor loops 401.1, 501.1 in the central point 411.1, 511.1 of the circuit, and furthermore the preferred direction 411, 511 intersects the second of the circular conductor loops 401.2, 501.2 in the central point 411.2, 511.2 of the circuit. The central point 411.3, 511.3 of the preferred direction 411, 511 is symmetrically between the central points of the circuits 411.1, 411.2, 511.1, 511.2.

In the first example embodiment of a part-body coil 400, shown in FIG. 4, the first conductor loop 401.1 comprises a plurality of first capacitors 403.1, 403.2, 403.3, which in this case are embodied as condensers. In each case, one of the capacitors 403.1, 403.2, 403.3 is embodied on the first conductor loop between two adjacent contact points of the straight conductors 402.1, 402.2, 402.3. Similarly, the second conductor loop 401.2 has a plurality of first capacitors 404.1, 404.2, 404.3, which in this case are embodied as condensers. In each case, one of the capacitors 404.1, 404.2, 404.3 is embodied on the first conductor loop between two adjacent contact points of the straight conductors 402.1, 402.2, 402.3.

In the second example embodiment of a part-body coil 500, shown in FIG. 5, the straight conductors 502.1, 502.2, 502.3 each comprise a capacitor 503.1, 503.2, 503.4, which capacitors are likewise embodied as condensers.

The part-body coils shown 400, 500 radially enclose an examination volume 410, 510 relative to a preferred direction 411, 511, the preferred direction 411, 511 being parallel here to the third axis Z. In these example embodiments, the examination volume 410, 510 is cylindrical in design but alternatively other volumes are conceivable as an examination volume, in particular examination volumes similar to a cylinder in shape, an examination volume being similar to a cylinder when every intersection orthogonal to the preferred direction 411, 511 is a circular area or an elliptical area or a convex area. Here, "enclose" is therefore understood to mean that the part-body coils 400, 500 that are shown enclose the examination volume 400, 500 despite the gaps that exist between the straight conductors 402.1, 402.2, 402.3, 502.1, 502.2, 502.3.

The part-body coils shown 400, 500 are designed to generate inside them a magnetic field with an alignment parallel to a plane which extends from the first axis X and the second axis Y. In FIG. 4, for example, the straight conductors 402.2 and 402.3, together with the sections of the circular conductor loops 401.1, 401.2 that are between them, form a first effective conductor loop, and in FIG. 5, for example, the straight conductors 502.2 and 502.3, together with the sections of the circular conductor loops 401.1, 401.2 that are between them, form a first effective conductor loop. Said first effective conductor loop has an inductance, it being possible for the inductance to be calculated from the geometry of the first effective conductor loop. Furthermore, the first effective conductor loop has a capacitance that is essentially defined by the reciprocal value of the sum of the inverse capacitances 403.2 and 404.2 or 503.2 and 503.3. From the inductance and the capacitance of the first effective conductor loop, the natural angular frequency $\omega_{BC}$ or the natural frequency $f_{BC}$ of the first effective conductor loop can be calculated. The natural angular frequency $\omega_{BC}$ or the natural frequency $f_{BC}$ then corresponds to one of the natural angular frequencies or to one of the natural frequencies of the part-body coil 400, 500 when the interactions of the effective conductor loops with one another are negligible.

In particular, when all the effective conductor loops in the part-body coil 400, 500 are constructed in the same way and have the same natural angular frequency $\omega_{BC}$ or the natural frequency $f_{BC}$, the natural angular frequency $\omega_{BC}$ or the natural frequency $f_{BC}$ corresponds to the natural angular frequency or to the natural frequency of the part-body coil 400, 500 when the interactions of the effective conductor loops with one another are negligible. If the interactions of the effective conductor loops with one another are not negligible, then the natural frequency of the part-body coil 400, 500 shifts, due to the interaction.

If the curve in the circular conductor loops 401.1, 401.2 or 501.1, 501.2 is disregarded, the first effective conductor loop is embodied orthogonally to the second axis Y. By way of excitation and resonant amplification, the first effective conductor loop can therefore generate inside the part-body coil 400, 500 a magnetic field that is designed to be parallel or antiparallel to the second axis Y. The first effective conductor loop can in particular work together with the effective conductor loop that is opposite to it in the part-body coil 400, 500 relative to the preferred direction 411, 511 in order to generate a magnetic field parallel or antiparallel to the second axis Y.

Altogether, the part-body coils 400, 500 include eight effective conductor loops. Alternatively, other numbers of effective conductor loops are also possible. In particular, part-body coils with 16 or with 32 effective conductor loops are known. Below, the second effective conductor loop denotes one of the two adjacent effective conductor loops in the first effective conductor loop, and N denotes the number of effective conductor loops in the part-body coil (in the part-body coil 400 that is shown, N=8). Where there is excitation and resonant amplification, the second effective conductor loop can generate a magnetic field that is rotated by 360°/N or by 180°−(360°/N) compared with the magnetic field of the first effective conductor loop. By appropriate resonant excitation, the part-body coil 400, 500 can therefore generate inside it circularly polarized electromagnetic radiation, the polarization plane being parallel to the first axis X and parallel to the second axis Y.

In the example embodiment shown, the circular conductor loops 401.1, 401.2, 501.1, 501.2 and the straight conductors 402.1, 402.2, 402.3, 502.1, 502.2, 502.3 of the part-body coil 400, 500 are embodied such that they conduct electricity by including an electricity-conducting material, in particular copper. The circular conductor loops 401.1, 401.2, 501.1, 501.2 and/or the straight conductors 402.1, 402.2, 402.3, 502.1, 502.2, 502.3 can include in particular an electricity-conducting wire, which is shaped according to the shape of the respective conductor loop or of the respective conductor. The circular conductor loops 401.1, 401.2, 501.1, 501.2 and/or the straight conductors 402.1, 402.2, 402.3, 502.1, 502.2, 502.3 can further include insulation for the wire and in particular, the insulation can completely encase the wire. Polyethylene, polyurethane and polyvinyl chloride are known as insulation materials. In the example embodiment shown, the circular conductor loops 401.1, 401.2, 501.1, 501.2 and the straight conductors 402.1, 402.2, 402.3, 502.1, 502.2, 502.3 are embodied as copper wires that are sheathed in polyurethane.

FIG. 6 shows a magnetic resonance unit 600 that includes a transmission coil 100, a part-body coil 400 and a magnet unit 601 shown in diagram form by a section orthogonal to the second axis Y. The magnet unit 601 encloses an examination aperture 602 to accommodate a patient 603. In the present example embodiment, the examination aperture 602 is cylindrical in design and surrounded in a circumferential direction by the magnet unit 601 in the shape of a hollow cylinder. Basically, however, an embodiment of the examination aperture 602 that deviates therefrom is entirely conceivable. The patient 603 can be moved into the examination aperture 602 via a patient-positioning apparatus 604. The patient-positioning apparatus 604 has for this purpose a patient couch that is designed to be moveable inside the examination aperture 602. The magnet unit 601 includes a main magnet unit 605 to generate a strong and in particular a homogeneous main magnetic field 606 inside the examination aperture 602. The magnet unit 601 is protected outwardly by a housing 609.

The magnet unit 601 further comprises a gradient coil unit 607 to generate magnetic field gradients that are used for spatial encoding during an imaging procedure. The gradient coil unit 607 is controlled via a gradient control unit 612 of the MR control and evaluation unit 610. In the example embodiment shown, the transmission coil 100 is arranged under the patient-positioning apparatus 604 and cannot be moved with the patient-positioning apparatus 604. The transmission coil 100 and the part-body coil 400 that is inductively coupled to the transmission coil 100 are controlled by a high frequency antenna control unit 611 of the MR control and evaluation unit 610 and emit high frequency alternating fields at least into the examination volume that is enclosed by the part-body coil 400. The part-body coil 400 is furthermore designed to receive magnetic resonance signals, which can be transmitted by inductive coupling to the transmission coil 100 and hence to the high frequency antenna control unit 611 of the MR control and evaluation unit 610.

The gradient coil unit 607 can generate in particular magnetic fields with a gradient in the direction of the first axis X, in the direction of the second axis Y, or in the direction of the third axis Z. For this purpose, the gradient coil unit 607 includes in this example embodiment three gradient coil subunits, each generating a magnetic field with a gradient in the direction of one of the axes X, Y, Z.

To control and/or monitor the main magnet 605 and the gradient coil unit 607, the magnet unit 601 is connected to an MR control and evaluation unit 610. The MR control and evaluation unit 610 centrally controls the magnet unit 601 and the transmission coil 100 by, for example, running a predetermined gradient echo imaging sequence. Here the control is achieved via a high frequency antenna control unit 611 and a gradient control unit 612. In addition, the MR control and evaluation unit 610 includes an evaluation unit that is not shown in greater detail for evaluating medical imaging data that has been acquired during a magnetic resonance examination. Furthermore, the MR control and evaluation unit 610 includes a user interface, which is not shown in greater detail, said interface being connected to a display unit 613 and an input unit 614. Control data, such as imaging parameters for example, and also reconstructed magnetic resonance images, can be displayed on the display unit 613, on at least one monitor for example, for medical operating personnel. Via the input unit 614, data and/or parameters can be input by medical operating personnel during a measurement procedure.

Figure 7:
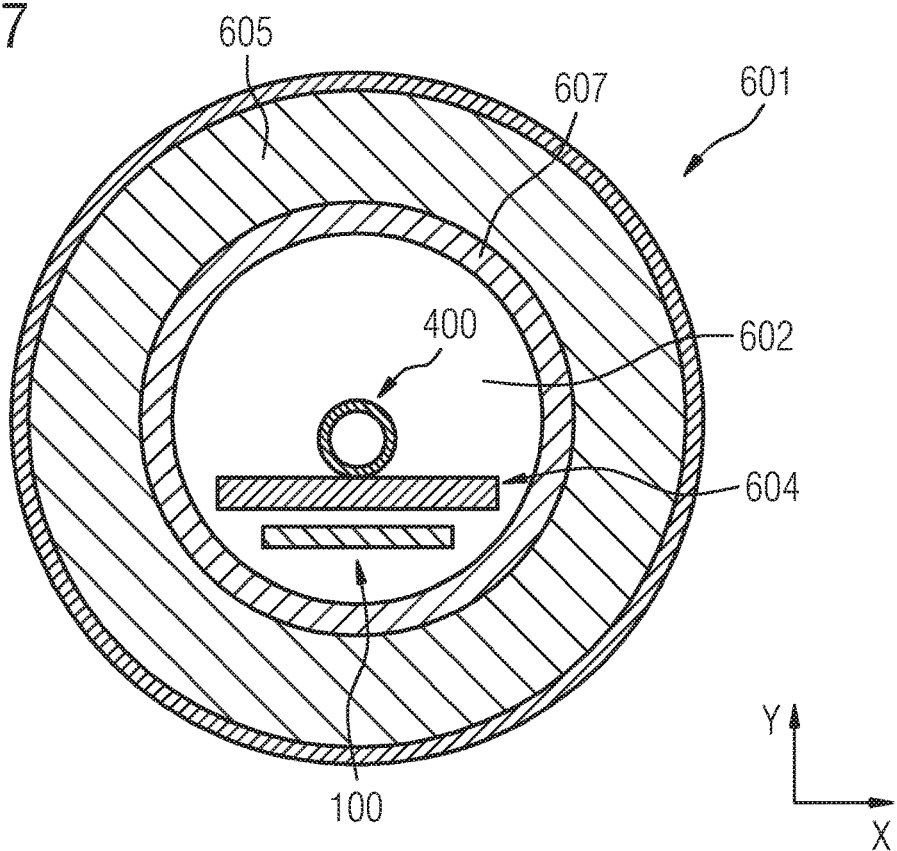
Figure 8:
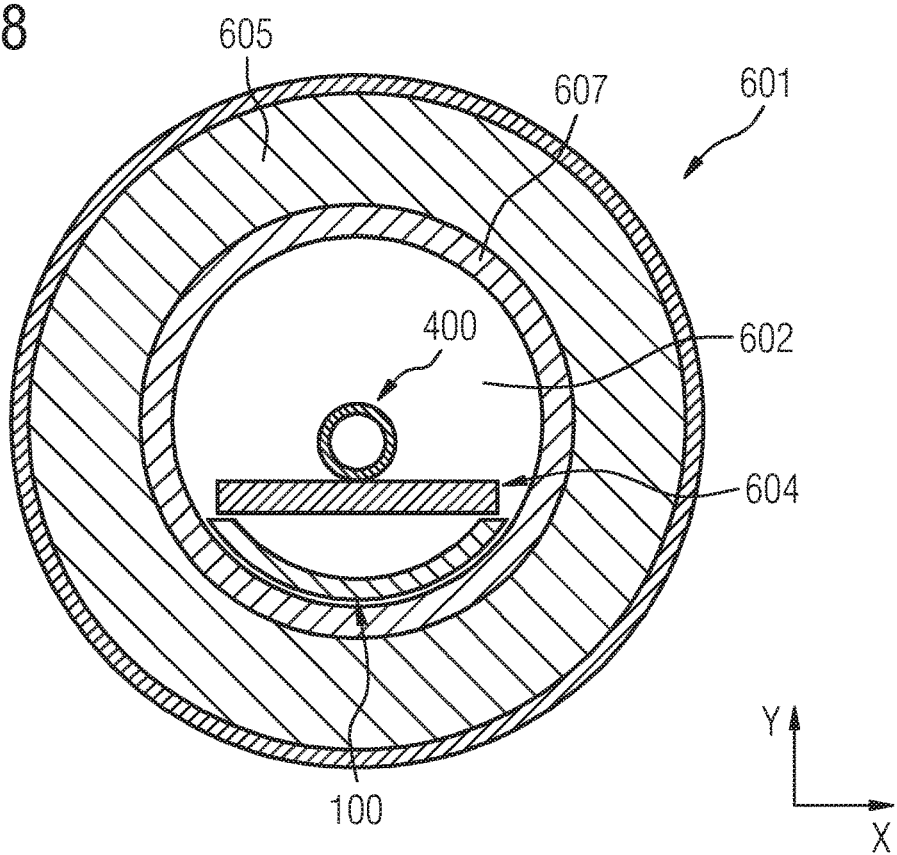

FIG. 7 shows a cross-section orthogonal to the third axis Y through a magnetic resonance unit 600 including a planar transmission coil 100 and a part-body coil 400 (or 500). FIG. 8 shows a cross-section orthogonal to the third axis Y through a magnetic resonance unit 600 including a curved transmission coil 100 and a part-body coil 400 (or 500). Both in FIG. 7 and in FIG. 8, the transmission coil 100 is planar in design. FIG. 7 and FIG. 8 differ only in the curve of the transmission coil 100. To simplify the diagram, both figures confine themselves to showing the essential elements.

Both in FIG. 7 and in FIG. 8, the extent of the transmission coil 100 relative to the first axis X is greater than the extent of the part-body coil 400, 500 relative to an axis that is orthogonal to the preferred direction 411, 511. In particular, the transmission coil 100 cannot therefore be arranged inside the examination volume 400, 500.

Both in FIG. 7 and in FIG. 8, a particularly high coupling efficiency can be achieved between the transmission coil 100 and the part-body coil 400, 500 when the preferred direction 411, 511 of the part-body coil 400, 500 is aligned parallel to the third axis Z and hence parallel to the main magnetic field 606, and when the central point 411.3, 511.3 of the preferred direction 411, 511 of the part-body coil 400, 500 has the same coordinates relative to the first axis X and relative to the third axis Z as the point at which the second conductor loop 102 overlaps itself. In other words, the central point 411.3, 511.3 of the preferred direction 411, 511 relative to the second axis is above the point where it self-overlaps. In other words this means that, relative to the second axis Y, the transmission coil 100 is arranged above the part-body coil 400, 500. In this arrangement, the strength of the coupling can vary with the distance of the part-body coil 400, 500 from the transmission coil 100.

In the example embodiment shown in FIG. 7, the transmission coil 100 can be designed in particular as part of the patient-positioning apparatus 604. The transmission coil can optionally be moveable with the patient-positioning apparatus 604. In the example embodiment shown, the transmission coil 100 is arranged on the side of the patient-positioning apparatus 604 that is turned away from the patient. Alternatively, the transmission coil 100 can also be arranged on the side of the patient-positioning apparatus 604 that is turned towards the patient 603, and furthermore the transmission coil 100 can also alternatively be arranged inside the patient-positioning apparatus 604.

In the example embodiment shown in FIG. 7, the patient-positioning apparatus 604 further includes markings for placing a part-body coil 400, 500 in order to arrange the part-body coil 400, 500 in as simple a manner as possible such that the part-body coil 400, 500 and the transmission coil 100 have a coupling efficiency that is as high as possible. A marking can be a place that is in a contrasting color or a pattern or, alternatively, the patient-positioning apparatus 604 can also be shaped to create a marking by, for example, there being a raised area or a recess in the patient-positioning apparatus. Alternatively, the patient-positioning apparatus 604 and/or the part-body coil 400, 500 can be designed to be detachably connected to each other.

In the example embodiment shown in FIG. 8, the transmission coil 100 can be arranged in particular within the housing 609 as part of the magnet unit 601. Alternatively, it is also possible to arrange the transmission coil 100 inside the examination aperture 602 on the side of the patient-positioning apparatus 604 that is turned away from the patient 603. If the transmission coil 100 is curved in design, as in the example embodiment shown, then the space available in the examination aperture 602 below the patient-positioning apparatus 604 can be optimally utilized and the transmission coil 100 can be designed to be as large as possible.

In the example embodiment shown in FIG. 8, an arrangement of the part-body coil 400, 500 and of the transmission coil 100 can be achieved whereby the transmission coil 100 transmits first high frequency radiation, and the patient-positioning apparatus 604 is moved with the part-body coil 400, 500, and in a plurality of positions of the patient-positioning apparatus 604 and hence in a plurality of positions of the part-body coil 400, 500, an electrical parameter of the transmission coil 100 is measured; in particular a first measurement of the electrical parameter can be carried out at a first position of the part-body coil 400, 500 and a second measurement of the electrical parameter at a second position of the part-body coil 400, 500.

Here, the first measurement of the electrical parameter results in a first measured value of the electrical parameter, and the second measurement of the electrical parameter results in a second measured value of the electrical parameter. The electrical parameter can in particular be the amplitude of the current or of the voltage at a point or between two points in the transmission coil 100. Alternatively, the electrical parameter can also relate to the reflection factor or the impedance of the transmission coil 100.

Based on the first measured value of the electrical parameter and on the second measured value of the electrical parameter, the coupling efficiency can be determined qualitatively; in particular it can be determined whether the coupling efficiency in the first position is greater than, equal to, or less than the coupling efficiency in the second position. In particular, for the use of the coil arrangement, it is possible to use the position at which the coupling efficiency is greater. It is optionally also possible, to carry out additional measurements of the electrical parameters at further positions in order to achieve a maximum coupling efficiency between the transmission coil 100 and the part-body coil 400, 500.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A coil arrangement for transmitting high frequency radiation, comprising:
    a transmission coil configured to be spaced apart from a patient on a patient couch; and
    a passive, tubular part-body coil, designed to radially enclose an examination volume relative to a direction, the examination volume configured to include a part of a body of a patient, the passive, tubular part-body coil being arranged opposite the transmission coil,
    wherein the passive, tubular part-body coil and the transmission coil are galvanically decoupled, and wherein the passive, tubular part-body coil and the transmission coil are inductively coupled,
    wherein the transmission coil is configured to emit a first high frequency radiation, to excite the passive, tubular part-body coil inductively, to cause an enforced electromagnetic oscillation, and
    wherein the passive, tubular part-body coil is configured to emit second high frequency radiation in an event of an enforced electromagnetic oscillation.

2. The coil arrangement of claim 1, wherein the transmission coil is arranged outside the examination volume.

3. The coil arrangement of claim 2, wherein the transmission coil and the passive, tubular part-body coil are arranged such that a coupling efficiency of the transmission coil and of the passive, tubular part-body coil is relatively greater than 0.5.

4. The coil arrangement of claim 3, wherein the coupling efficiency of the transmission coil and of the passive, tubular part-body coil is relatively greater than 0.9.

5. The coil arrangement of claim 4, wherein the transmission coil is embodied to generate, in the examination volume, a magnetic field parallel to a first magnetic field direction when the transmission coil and the passive, tubular part-body coil are arranged such that the coupling efficiency of the transmission coil and of the passive, tubular part-body coil is relatively greater than 0.9, and wherein the first magnetic field direction is perpendicular to the direction.

6. The coil arrangement of claim 3, wherein the transmission coil is embodied to generate, in the examination volume, a magnetic field parallel to a first magnetic field direction when the transmission coil and the passive, tubular part-body coil are arranged such that the coupling efficiency of the transmission coil and of the passive, tubular part-body coil is relatively greater than 0.5, and wherein the first magnetic field direction is perpendicular to the direction.

7. The coil arrangement of claim 6, wherein the transmission coil is embodied to generate, in the examination volume, a magnetic field parallel to a first magnetic field direction when the transmission coil and the passive, tubular part-body coil are arranged such that the coupling efficiency of the transmission coil and of the passive, tubular part-body coil is relatively greater than 0.9, and wherein the first magnetic field direction is perpendicular to the direction.

8. The coil arrangement of claim 2, wherein the transmission coil is embodied as part of a patient-positioning apparatus, wherein the transmission coil is embodied as part of a magnet unit, and wherein a relative position between the transmission coil and a patient-positioning apparatus is modifiable.

9. The coil arrangement of claim 1, wherein the transmission coil and the passive, tubular part-body coil are arranged such that a coupling efficiency of the transmission coil and of the passive, tubular part-body coil is relatively greater than 0.5.

10. The coil arrangement of claim 9, wherein the transmission coil is embodied to generate, in the examination volume, a magnetic field parallel to a first magnetic field direction when the transmission coil and the passive, tubular part-body coil are arranged such that the coupling efficiency of the transmission coil and of the passive, tubular part-body coil is relatively greater than 0.5, and wherein the first magnetic field direction is perpendicular to the direction.

11. The coil arrangement of claim 10, wherein the transmission coil is embodied to generate, in the examination volume, a magnetic field parallel to a first magnetic field direction when the transmission coil and the passive, tubular part-body coil are arranged such that the coupling efficiency of the transmission coil and of the passive, tubular part-body coil is relatively greater than 0.9, and wherein the first magnetic field direction is perpendicular to the direction.

12. The coil arrangement of claim 9, wherein the coupling efficiency of the transmission coil and of the passive, tubular part-body coil is relatively greater than 0.9.

13. The coil arrangement of claim 12, wherein the transmission coil is embodied to generate, in the examination volume, a magnetic field parallel to a first magnetic field direction when the transmission coil and the passive, tubular part-body coil are arranged such that the coupling efficiency of the transmission coil and of the passive, tubular part-body coil is relatively greater than 0.9, and wherein the first magnetic field direction is perpendicular to the direction.

14. The coil arrangement of claim 1, wherein a capacitance and an inductance of the passive, tubular part-body coil are embodied such that a resonant frequency of the passive, tubular part-body coil corresponds to a frequency of the first high frequency radiation.

15. The coil arrangement of claim 1, wherein the passive, tubular part-body coil is designed to excite a nuclear spin in the examination volume to create a precession around an axis of a main magnetic field when the passive, tubular part-body coil in a main magnetic field is arranged such that the direction and an axis of the main magnetic field are parallel.

16. The coil arrangement of claim 15, wherein a respective frequency of the second high frequency radiation respectively corresponds to a Larmor frequency of an atomic nucleus in the examination volume relative to the main magnetic field.

17. The coil arrangement of claim 16, wherein the second high frequency radiation is circularly polarized around the axis of the main magnetic field.

18. The coil arrangement of claim 15, wherein the second high frequency radiation is circularly polarized around the axis of the main magnetic field.

19. The coil arrangement of claim 1, wherein the transmission coil is part of a magnet unit, and wherein a relative position between the transmission coil and the patient couch is modifiable.

20. The coil arrangement of claim 1, wherein the transmission coil is a loop butterfly coil.

21. The coil arrangement of claim 1, wherein the passive, tubular part-body coil is embodied as a birdcage coil.

22. The coil arrangement of claim 1, wherein the passive, tubular part-body coil is further embodied to receive third high frequency radiation.

23. The coil arrangement of claim 1, wherein the transmission coil is embodied to excite a nuclear spin with the passive, tubular part-body coil, without inductive coupling, causing a precession around an axis of a main magnetic field.

24. The coil arrangement of claim 1, wherein the transmission coil is arranged opposite a first side of a patient couch and the passive, tubular part-body coil is arranged opposite a second side of the patient couch.

25. The coil arrangement of claim 1, wherein the transmission coil is part of a patient couch and is simultaneously movable with the patient couch.

26. The coil arrangement of claim 1, wherein the transmission coil has a planar shape.

27. The coil arrangement of claim 1, wherein the transmission coil has a arcuate shape.

28. The coil arrangement of claim 1, wherein the transmission coil and the passive, tubular part-body coil are arranged opposite with respect to an axis perpendicular to a main magnetic field direction.

29. A method, comprising:
   determining a magnetic resonance dataset relating to an examination volume, using of a coil arrangement in a magnetic resonance unit, the coil arrangement including
      providing a transmission coil spaced apart from a patient on a patient couch, and
      providing a passive, tubular part-body coil arranged opposite the transmission coil, the passive, tubular part-body coil being designed to radially enclose an examination volume relative to a direction, the examination volume including a part of a body of a patient,
   wherein the passive, tubular part-body coil and the transmission coil are galvanically decoupled, and wherein the passive, tubular part-body coil and the transmission coil are inductively coupled,
   wherein the transmission coil is configured to emit a first high frequency radiation, to excite the passive, tubular part-body coil inductively, to cause an enforced electromagnetic oscillation, and
   wherein the passive, tubular part-body coil is configured to emit second high frequency radiation in an event of an enforced electromagnetic oscillation.

30. The method of claim 29, wherein the passive, tubular part-body coil is placed on the patient couch based upon a marking on the patient couch.

31. The method claim 29, wherein the transmission coil is configured to emit high frequency radiation, wherein the passive, tubular part-body coil is placed based upon a comparison of a first measurement and of a second measurement of an electrical parameter of the transmission coil, wherein in the first measurement, the passive, tubular part-body coil includes a first position relative to the transmission coil, and wherein in the second measurement, the passive, tubular part-body coil includes a second position relative to the transmission coil.

32. The method of claim 29, wherein the transmission coil and the passive, tubular part-body coil are arranged opposite with respect to an axis perpendicular to a main magnetic field direction.

33. A coil arrangement for transmitting high frequency radiation, comprising:
   a high frequency transmission coil configured to actively transmit electromagnetic radiation to a resonant, passive, tubular part-body coil;
   a passive, tubular part-body coil, designed to radially enclose an examination volume relative to a direction, the examination volume configured to include a part of a body of a patient; and
   a high frequency antenna controller configured to emit high frequency alternating fields via the transmission coil at least into the examination volume that is enclosed by the part-body coil,
   wherein the passive, tubular part-body coil and the transmission coil are galvanically decoupled, and wherein the passive, tubular part-body coil and the transmission coil are inductively coupled,
   wherein the transmission coil is embodied, by way of an emitted first high frequency radiation, to excite the passive, tubular part-body coil inductively, to cause an enforced electromagnetic oscillation, and wherein the passive, tubular part-body coil is configured to emit second high frequency radiation in an event of an enforced electromagnetic oscillation.

\* \* \* \* \*